(12) United States Patent
Kaibara

(10) Patent No.: US 9,177,915 B2
(45) Date of Patent: Nov. 3, 2015

(54) NITRIDE SEMICONDUCTOR DEVICE

(71) Applicant: PANASONIC CORPORATION, Osaka (JP)

(72) Inventor: Kazuhiro Kaibara, Toyama (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 170 days.

(21) Appl. No.: 14/133,102

(22) Filed: Dec. 18, 2013

(65) Prior Publication Data

US 2014/0103537 A1 Apr. 17, 2014

Related U.S. Application Data

(63) Continuation of application No. PCT/JP2012/003825, filed on Jun. 12, 2012.

(30) Foreign Application Priority Data

Jun. 24, 2011 (JP) ................. 2011-140129

(51) Int. Cl.
*H01L 23/485* (2006.01)
*H01L 23/528* (2006.01)
(Continued)

(52) U.S. Cl.
CPC .......... *H01L 23/528* (2013.01); *H01L 23/4824* (2013.01); *H01L 23/53238* (2013.01); *H01L 24/07* (2013.01); *H01L 24/08* (2013.01); *H01L 24/09* (2013.01); *H01L 29/0692* (2013.01); *H01L 29/41725* (2013.01); *H01L 29/812* (2013.01); *H01L 24/03* (2013.01); *H01L 24/05* (2013.01); *H01L 24/06* (2013.01);
(Continued)

(58) Field of Classification Search
None
See application file for complete search history.

(56) References Cited

U.S. PATENT DOCUMENTS 4,972,237 A 11/1990 Kawai
6,268,632 B1 7/2001 Sugimura et al.
(Continued)

FOREIGN PATENT DOCUMENTS

JP 09-064050 A 3/1997
JP 11-87345 A 3/1999
(Continued)

OTHER PUBLICATIONS

Notice of Allowance issued in U.S. Appl. No. 13/733,827 with Date Mailed Feb. 24, 2014.
Notice of Allowance issued in U.S. Appl. No. 14/152,681 dated Jul. 18, 2014.
International Search Report issued in PCT/JP2012/003825, dated Jul. 24, 2012, with English translation.

*Primary Examiner* — Fei Fei Yeung Lopez
(74) *Attorney, Agent, or Firm* — McDermott Will & Emery LLP

(57) ABSTRACT

A nitride semiconductor device includes first electrode interconnect layers and second electrode interconnect layers formed over a nitride semiconductor layer, a first insulating film formed on the first and second electrode interconnect layers and including first openings, first interconnect layers and second interconnect layers formed on the first insulating film and respectively connected to the first electrode interconnect layers and the second electrode interconnection layers through the first openings, a second insulating film formed on the first and second interconnect layers and including second openings, and a first pad layer and a second pad layer formed on the second insulating film and respectively connected to the first interconnect layers and the second interconnect layers through the second openings.

8 Claims, 6 Drawing Sheets

(51) Int. Cl.
  H01L 23/00    (2006.01)
  H01L 23/482   (2006.01)
  H01L 29/417   (2006.01)
  H01L 23/532   (2006.01)
  H01L 29/812   (2006.01)
  H01L 29/06    (2006.01)
  H01L 29/778      (2006.01)
  H01L 29/20       (2006.01)

(52) U.S. Cl.
  CPC .............. *H01L 24/37* (2013.01); *H01L 24/45* (2013.01); *H01L 29/2003* (2013.01); *H01L 29/7787* (2013.01); *H01L 2224/0345* (2013.01); *H01L 2224/0346* (2013.01); *H01L 2224/04034* (2013.01); *H01L 2224/04042* (2013.01); *H01L 2224/05027* (2013.01); *H01L 2224/05611* (2013.01); *H01L 2224/05639* (2013.01); *H01L 2224/05644* (2013.01); *H01L 2224/05655* (2013.01); *H01L 2224/05671* (2013.01); *H01L 2224/06181* (2013.01); *H01L 2224/37124* (2013.01); *H01L 2224/37144* (2013.01); *H01L 2224/37147* (2013.01); *H01L 2224/45014* (2013.01); *H01L 2224/45015* (2013.01); *H01L 2224/45124* (2013.01); *H01L 2224/45144* (2013.01); *H01L 2224/45147* (2013.01); *H01L 2924/00014* (2013.01); *H01L 2924/12032* (2013.01); *H01L 2924/13062* (2013.01); *H01L 2924/13064* (2013.01)

(56) References Cited

U.S. PATENT DOCUMENTS

| | | | |
|---|---|---|---|
| 7,550,821 | B2 | 6/2009 | Shibata |
| 7,915,645 | B2 | 3/2011 | Briere |
| 8,344,463 | B2 | 1/2013 | Yanagihara |
| 8,569,843 | B2 | 10/2013 | Yanagihara |
| 2005/0189561 | A1 | 9/2005 | Kinzer et al. |
| 2005/0189562 | A1 | 9/2005 | Kinzer et al. |
| 2005/0274977 | A1 | 12/2005 | Saito et al. |
| 2008/0073671 | A1 | 3/2008 | Yamane et al. |
| 2008/0149940 | A1 | 6/2008 | Shibata et al. |
| 2008/0211567 | A1* | 9/2008 | Morita et al. ............... 327/425 |
| 2010/0213503 | A1 | 8/2010 | Yanagihara et al. |
| 2010/0320505 | A1 | 12/2010 | Okamoto et al. |
| 2013/0119486 | A1 | 5/2013 | Kaibara |

FOREIGN PATENT DOCUMENTS

| | | |
|---|---|---|
| JP | 2000-049169 A | 2/2000 |
| JP | 2001-203219 A | 7/2001 |
| JP | 2002-110988 A | 4/2002 |
| JP | 2004-134434 A | 4/2004 |
| JP | 2008-177527 A | 7/2008 |
| JP | 2010-80877 A | 4/2010 |
| JP | 2010-147254 A | 7/2010 |
| WO | 85-02061 A1 | 5/1985 |
| WO | 85/02601 A1 | 6/1985 |

\* cited by examiner

NITRIDE SEMICONDUCTOR DEVICE

CROSS-REFERENCE TO RELATED APPLICATIONS

This is a continuation of International Application No. PCT/JP2012/003825 filed on Jun. 12, 2012, which claims priority to Japanese Patent Application No. 2011-140129 filed on Jun. 24, 2011. The entire disclosures of these applications are incorporated by reference herein.

BACKGROUND

The present disclosure relates to nitride semiconductor devices, and more particularly, to a nitride semiconductor device including electrode pads provided above an active region.

Group III-V nitride semiconductors which are represented by the general formula: $Al_xGa_{1-x-y}In_yN$, where $0 \leq x \leq 1$, $0 \leq y \leq 1$, and $0 \leq x+y \leq 1$, have a wide band gap and a direct transition band structure as their physical characteristics, and thus are applied to short-wavelength optical devices. Further, application of group III-V nitride semiconductors to electronic devices is also under consideration because the semiconductors have a high breakdown electric field and high electron saturation velocity as their characteristics.

In particular, hetero-junction field effect transistors (HFETs) utilizing two-dimensional electron gas (2DEG) produced at the interface between an aluminum gallium nitride ($Al_xGa_{1-x}N$, where $0 < x \leq 1$) layer and a gallium nitride (GaN) layer which are sequentially formed by epitaxial growth on a semi-insulating substrate are being developed as high output devices and high frequency devices. In the HFETs, in addition to electrons which are supplied from a carrier supply layer (i.e., an n-type AlGaN Schottky layer), charges are supplied by a polarization effect caused by spontaneous polarization and piezoelectric polarization. Consequently, the HFETs made of group III-V nitride semiconductors have an electron density higher than $10^{13}$ cm$^{-2}$, which is higher than that of HFETs made of aluminum gallium arsenide (AlGaAs) and gallium arsenide (GaAs) by about one digit. As such, the HFETs made of group III-V nitride semiconductors are expected to have a higher drain current density than that of the HFETs made of GaAs. An element having a maximum drain current larger than 1 A/mm is reported. See, for example, Yuji Ando, Yasuhiro Okamoto, Hironobu Miyamoto, Tatsuo Nakayama, Takashi Inoue, Masaaki Kuzuhara, Evaluation of High Breakdown Voltage AlGaN/GaN Heterojunction FET, IEICE Technical Report, ED2002-214, CPM2002-105 (2002-10), pp. 29-34. Furthermore, since group III-V nitride semiconductors have a wide band gap (for example, GaN has a band gap of 3.4 eV) and also exhibit high breakdown voltage characteristics, the HFETs made of group III-V nitride semiconductors can have a breakdown voltage of 100 V or more between a gate electrode and a drain electrode. Therefore, application of electronic devices made of group III-V nitride semiconductors such as HFETs to high frequency elements and elements capable of handling greater power and smaller in size than conventional devices is under consideration.

The above described characteristics of group III-V nitride semiconductors enable group III-V nitride semiconductor devices to have an active region of about one-third to one-tenth the sizes of an active region in silicon (Si) semiconductor devices. However, conventional group III-V nitride semiconductor devices, whose electrode pads for connection of wiring have large areas, have a disadvantage that the conventional group III-V nitride semiconductor devices cannot be sufficiently downsized. In particular, when the group III-V nitride semiconductor devices are used as power devices through which a large current passes, the pads can be downsized to a limited extent because it is desirable that wires and ribbons connected to the pads have large diameters and large sizes.

To overcome this disadvantage, the so-called pad-on-element structure in which electrode pads are formed above an active region is proposed in Japanese Unexamined Patent Publication No. 2008-177527, for example. When pad-on-element structure is employed in a power device which handles a high voltage, it is necessary to form an interlayer film having a large thickness in order to prevent a leakage current from being generated between the electrode pads and the electrodes located under the pads.

In order to obtain a high-efficiency device, it is essential to reduce on-resistance of the device. Further, a semiconductor device to be used as a power device needs to have characteristics of being capable of handling a large current and of having a high-breakdown voltage. Reducing on-resistance and increasing gate width allow a semiconductor device to possess these characteristics, and thereby cause the semiconductor device to have a larger maximum current.

SUMMARY

However, increasing the gate width of a FET in a linear manner causes an increase in interconnect resistance, which results in an increase in the on-resistance. Thus, sufficient reduction of the on-resistance cannot be achieved by increasing the gate width in a linear manner. This increasing of the gate width also causes a source potential to increase and a gate potential to decrease, and thereby reduces the voltage difference (AVGS) between source electrodes and the gate electrodes. Consequently, it is impossible to obtain a maximum current which is large as expected in view of the increase in the gate width.

It is therefore an object of the present disclosure to enable obtainment of a nitride semiconductor device of which on-resistance is reduced and the maximum current per gate width is large.

To achieve the object, the nitride semiconductor device of the present disclosure is configured such that an interconnect layer is sandwiched between an electrode interconnect layer and a pad layer.

Specifically, the nitride semiconductor device of the present disclosure includes a substrate; a nitride semiconductor layer formed over the substrate and including an active region; first electrode interconnect layers and second electrode interconnect layers alternately spaced from one another over the active region of the nitride semiconductor layer; a first insulating film formed on the first and second electrode interconnect layers, and including a plurality of first openings through which the first and second electrode interconnect layers are exposed; first interconnect layers and second interconnect layers alternately spaced from one another on the first insulating film, wherein the first interconnect layers are in electrical connection to the first electrode interconnect layers through associated ones of the first openings and extend in a direction intersecting with the first electrode interconnect layers, and wherein the second interconnect layers are in electrical connection to the second electrode interconnect layers through associated ones of the first openings and extend in a direction intersecting with the second electrode interconnect layers; a second insulating film formed on the first and second interconnect layers, and including a plurality of second openings through which the first and second interconnect layers are exposed; and a first pad layer and a second pad layer spaced from each other on the second insulating film and located above the active region, wherein the first pad layer is in electrical connection to the first interconnect layers through associated ones of the second openings, and the second pad layer is in electrical connection to the second interconnect layers through associated ones of the second openings.

According to the nitride semiconductor device of the present disclosure, the length of interconnects of the first and second interconnect layers that are respectively in electrical connection to the first electrode interconnect layers and the second electrode interconnect layers can be reduced, the apparent number of the interconnects can be increased, and interconnection resistance can be reduced. In this manner, it is possible to obtain the nitride semiconductor device of which the on-resistance is reduced and the maximum current per gate width is sufficiently large.

In the nitride semiconductor device of the present disclosure, each of the first interconnect layers and the second interconnect layers preferably includes a plurality of metal layers.

In this case, in each of the first interconnect layers and the second interconnect layers, it is preferable that the uppermost metal layer is more adhesive to the second insulating layer than to a lower metal layer which is in contact with the uppermost metal layer. It is also preferable that the uppermost metal layer is made of a material capable of preventing the metal layer located under the uppermost layer from dispersing in the second insulating layer.

Further, it is preferable that: each of the first interconnect layers and the second interconnect layers includes a first metal layer being in contact with the first insulating film, a second metal layer formed on the first metal layer, and a third metal layer which is an uppermost layer formed on the second metal layer, the first metal layer is more adhesive to the first insulating film than to the second and third metal layers; the second metal layer is made of a metal whose conductivity is higher than that of the first metal layer; and the third metal layer is more adhesive to the second insluting film than to the first and second metal layers.

Thus, forming each of the first interconnect layer and the second interconnect layer by using a high-conductive metal and metals which are highly adhesive to the insulating films located over and under the first and second interconnect layers can cause the interconnects to maintain a high conductivity and can prevent the interconnect layers from peeling off from the insulating films.

In the nitride semiconductor device of the present disclosure, the uppermost metal layer of each of the first interconnect layers and the second interconnect layers preferably has a glossiness of 1 or more.

When the second insulating film on the first and second interconnect layers is made of a photosensitive material, the uppermost metal layer having a glossiness of 1 or more facilitates formation of the second openings in the second insulating film.

In the nitride semiconductor device of the present disclosure, it is preferable that each of the first pad layer and the second pad layer includes a plurality of pad layers which are at the same potential, and the plurality of pad layers are each in connection to an external device.

In this manner, the resistance of the first interconnect layer and the second interconnect layer can be further reduced, and accordingly, the on-resistance can be reduced.

In the nitride semiconductor device of the present disclosure, each of the first pad layer and the second pad layer preferably includes a plurality of metal layers.

Thus, each of the first and second pad layers can include the lowermost layer which has a high adhesiveness to the second insulating film, and if necessary, which serves as a metal layer having barrier metal effects. Each of the first and second pad layers can also include an intermediate metal layer which has an excellent conductivity, and the uppermost metal layer which is suitable for connection to an external device. In this manner, it is possible to maintain the conductivity of each of the pad layers while preventing the interconnects and the insulating film that are in connection to the pad layers from peeling off from the pad layers.

In the nitride semiconductor device of the present disclosure, it is preferable that: each of the first and second electrode interconnect layers includes an electrode which is located on and in direct connection to the nitride semiconductor layer, and an electrode interconnect formed on the electrode, an electrode insulating film including openings through which the electrodes included in the first and second electrode interconnect layers are exposed is formed on the nitride semiconductor layer; and the electrode interconnects included in the first and second electrode interconnect layers are in electrical connection to the electrodes through the openings of the electrode insulating film.

Thus, the electrodes that are in direct connection to the nitride semiconductor layer and the interconnects that are in connection to the electrodes form the first electrode interconnect layers and the second electrode interconnect layers, which are interconnect metal layers having a high conductivity. When the device of the present disclosure is applied as a FET, whose unit size is determined depending on the distance between a source electrode and a drain electrode and the widths of these electrodes, the configuration in which the electrode interconnects located on the electrode insulating film have widths larger than the widths of the electrodes does not cause any problems. Thus, the resistance of the electrode interconnect layers can be reduced.

As described above, according to present disclosure, the nitride semiconductor device of which the on-resistance is reduced and the maximum current per gate width is large can be obtained.

BRIEF DESCRIPTION OF THE DRAWINGS

FIG. 3(a) is a plan view illustrating source electrode interconnects, drain electrode interconnects, and components located under the source and drain electrode interconnects. FIG. 3(b) is a plan view illustrating a first interlayer insulating film and components located under the first interlayer insulating film.

FIG. 4(a) is a plan view illustrating first interconnect layers, second interconnect layers, and components located under the first and second interconnect layers. FIG. 4(b) is a plan view illustrating a second interlayer insulating film and components located under the second interlayer insulating film.

DETAILED DESCRIPTION

Embodiment

A nitride semiconductor device according to an embodiment of the present disclosure will be described below with reference to FIGS. 1-4.

Figure 1:
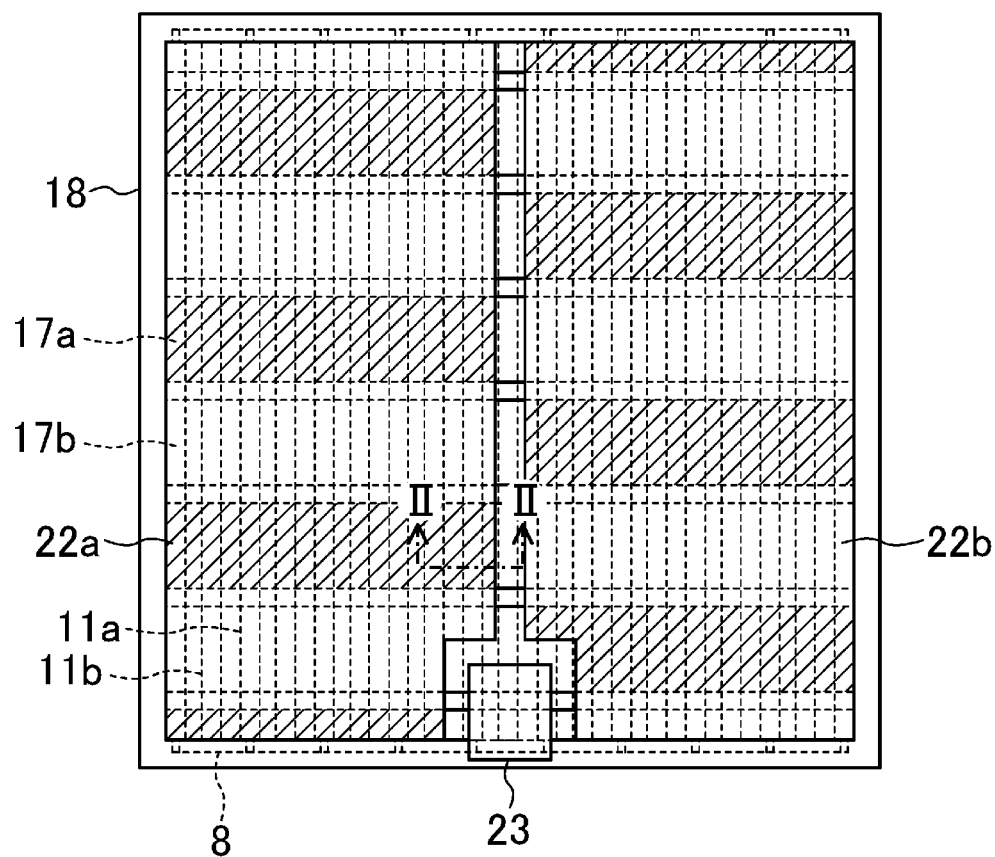
FIG. 1 is a plan view illustrating a nitride semiconductor device according to an embodiment of the present disclosure.
Figure 2:
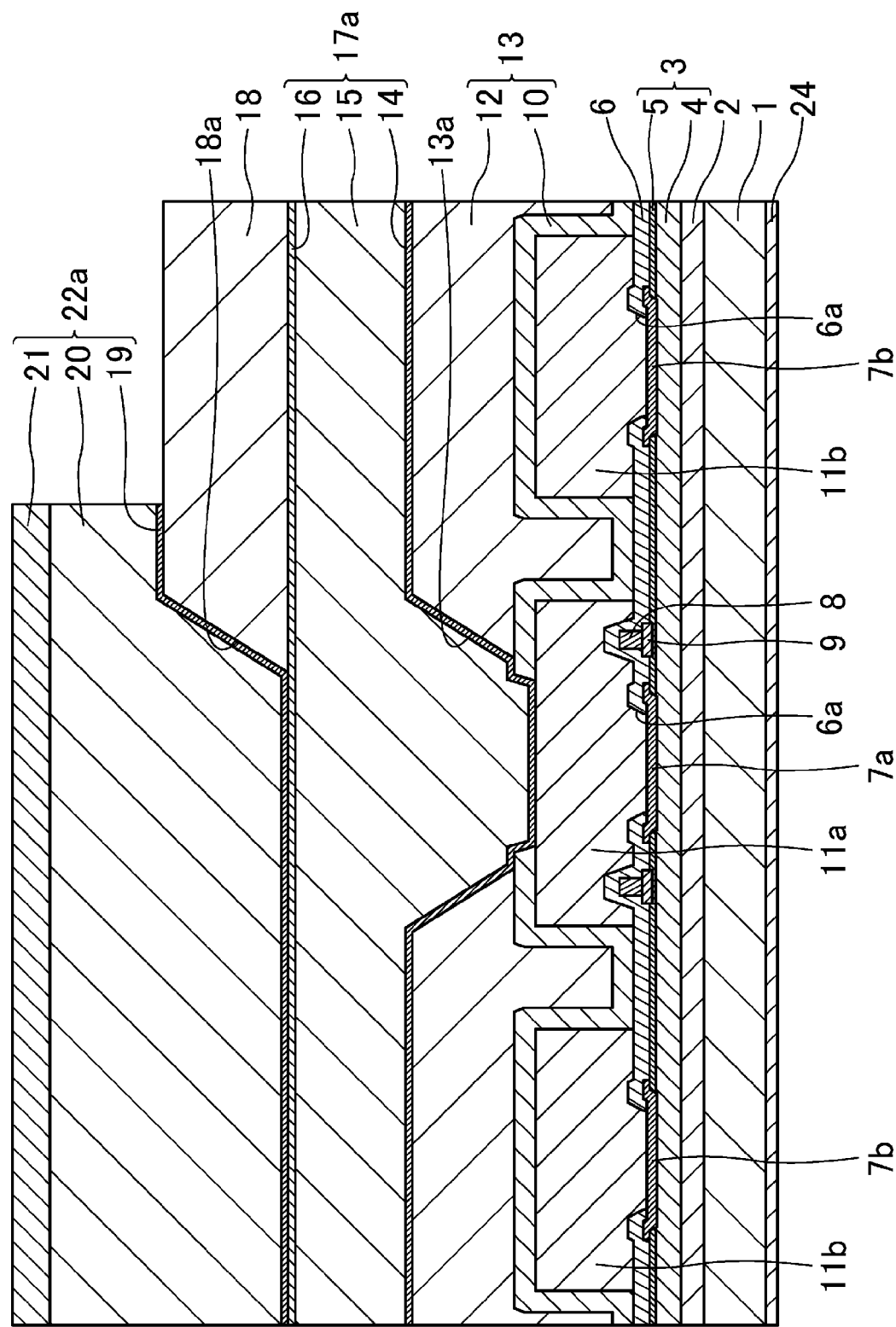
FIG. 2 is a cross-sectional view of the nitride semiconductor device according to the embodiment of the present disclosure, taken along the line II-II in FIG. 1.

As illustrated in FIGS. 1 and 2, the nitride semiconductor device of this embodiment includes a buffer layer 2 and a nitride semiconductor layer 3 sequentially formed on a substrate 1 made of silicon (Si). The nitride semiconductor layer 3 includes an undoped gallium nitride (GaN) layer 4 having a thickness of about 2.5 µm, and an undoped aluminum gallium nitride (AlGaN) layer 5 having a thickness of about 50 nm and formed on the undoped GaN layer 4. Two-dimensional electron gas (2DEG) which is produced in an interface region between the undoped GaN layer 4 and the undoped AlGaN layer 5 functions as a channel region.

On the nitride semiconductor layer 3, source electrodes 7a which are first electrodes and drain electrodes 7b which are second electrodes are alternately spaced from one another such that the electrodes 7a and 7b are in direct connection to the nitride semiconductor layer 3. In this embodiment, in order to reduce contact resistance, parts of the undoped AlGaN layer 5 and parts of the undoped GaN layer 4 are removed, and the source electrodes 7a and the drain electrodes 7b are formed such that the lower surfaces of the electrodes 7a and 7b are located lower than the interface between the undoped AlGaN layer 5 and the undoped GaN layer 4. The source electrodes 7a and the drain electrodes 7b are made of a metal such as titanium (Ti) or aluminum (Al). The thickness of the undoped AlGaN layer 5 is reduced in portions each of which is located between adjacent ones of the source electrodes 7a and the drain electrodes 7b and has a width of about 1 µm. P-type GaN layers 9 which have a thickness of about 200 nm and are doped with magnesium (Mg) are each formed on an associated one of the portions with the reduced thickness of the undoped AlGaN layer 5. Gate electrodes 8 made of, e.g., palladium (Pd), gold (Au), or platinum (Pt) are formed on the p-type GaN layers 9. The p-type GaN layers 9 and the undoped AlGaN layer 5 thus form PN junctions. Consequently, even if the voltage applied to the gate electrodes 8 is 0 V, depletion layer spreads in the undoped AlGaN layer 5 and the undoped GaN layer 4 from the p-type GaN layers 9 toward the substrate 1 and the drain electrodes 7b. In this manner, a current passing through the channel region is interrupted, and normally-off operation can be performed.

The nitride semiconductor device of this embodiment is a field effect transistor (a FET) having a multi-finger structure in which nitride semiconductors are used. Supposing that one source electrode 7a, one drain electrode 7b, and one gate electrode 8 which are adjacent to one another form a unit, it can be considered that the nitride semiconductor device of this embodiment includes a plurality of the units and the units are alternately inverted about the drain electrode 7b as the axis. As will be described later, electrical connections are established across the units, between the source electrodes 7a, between the drain electrodes 7b, and between the gate electrodes 8. In this manner, the gate width of the nitride semiconductor device can be considerably increased, and a power device capable of allowing a large current to pass can be obtained. In this embodiment, a region which includes the channel region and the region of the nitride semiconductor layer 3 where a group of the source electrodes 7a and the drain electrodes 7b are formed, and which is not dielectrically isolated is referred to as the active region.

An electrode insulating film 6 which has a thickness of about 300 nm and is made of silicon nitride (SiN) is formed on the nitride semiconductor layer 3, the source electrodes 7a, the drain electrodes 7b, the gate electrodes 8, and the p-type GaN layers 9. The electrode insulating film 6 has openings 6a through which parts of the surfaces (the upper surfaces) of the source and drain electrodes 7a and 7b are exposed. The electrode insulating film 6 is provided to stabilize the surface of the nitride semiconductor layer 3 and to prevent moisture from entering the nitride semiconductor layer 3 from an interlayer insulating film 12 which will be described later.

Figure 3A:
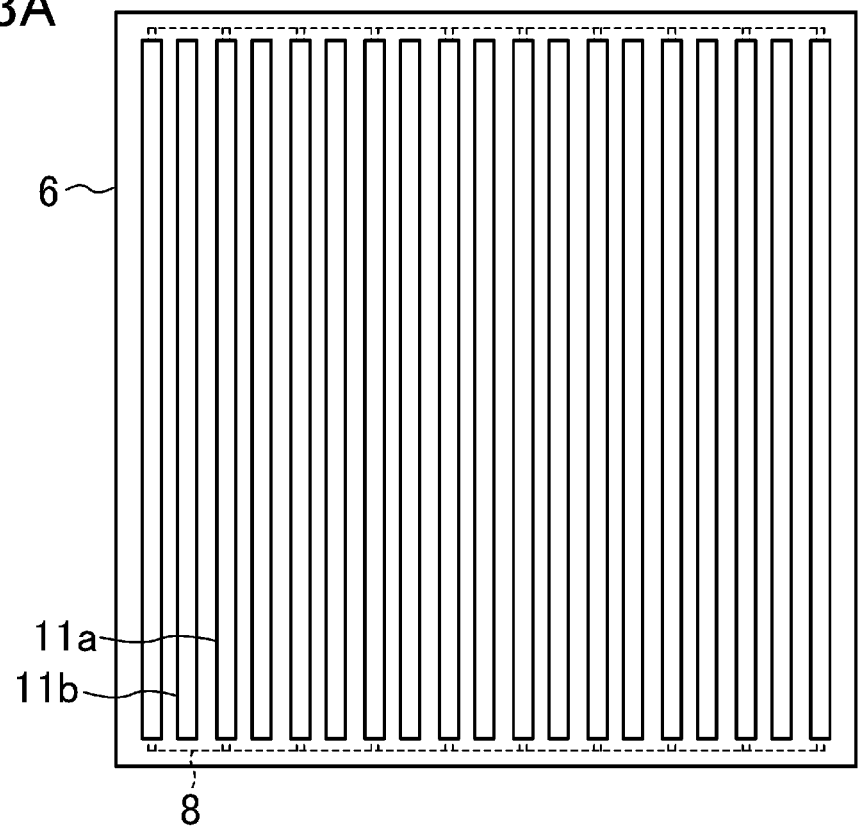
FIGS. 3(a) and 3(b) illustrate layers included in the nitride semiconductor device according to the embodiment of the present disclosure.

Source electrode interconnects 11a made of Au are formed on the source electrodes 7a such that the source electrode interconnects 11a are connected to the source electrodes 7a through associated ones of the openings 6a of the electrode insulating film 6. The source electrode interconnects 11a each include a Ti layer serving as adhesion layer to improve adhesion to the electrode insulating film 6. The source electrode interconnects 11a have a thickness of about 5 µm and a width which is approximate to or larger than the width of the source electrodes 7a and the width of the drain electrodes 7b. Here, each of the source electrode interconnects 11a on the source electrodes 7a covers the gate electrodes 8 included in the two units adjacent to each other, and the width of each of the source electrode interconnects 11a extends over the gate electrodes 8 toward the drain electrodes 7b. Each of the source electrode interconnects 11a thus functions as a source field plate. In a similar manner, drain electrode interconnects 11b are formed on the drain electrodes 7b such that the drain electrode interconnects 11b are connected to the drain electrodes 7b through associated ones of the openings 6a of the electrode insulating film 6. As illustrated in FIG. 3(a), first electrode interconnect layers each of which includes a stack of one source electrode 7a and one source electrode interconnect 11a, and second electrode interconnect layers each of which includes a stack of one drain electrode 7b and one drain electrode interconnect 11a are alternately spaced from and in parallel with one another. The gate electrodes 8 are in connection to each other in regions which are not covered with the source electrode interconnects 11a.

A protective film 10 which has a thickness of about 400 nm and is made of SiN is formed on the electrode insulating film 6, the source electrode interconnects 11a, and the drain electrode interconnects 11b. The protective film 10 serves, in a manner similar to the electrode insulating film 6, as a moisture-resistant layer for protecting the nitride semiconductor layer 3. At the same time, the protective film 10 also functions as an adhesion layer for the source electrode interconnects 11a, the drain electrode interconnects 11b, and the interlayer insulating film 12 which is located above the electrode interconnects 11a and 11b, as will described later.

The interlayer insulating film 12 which has a thickness of about 10 µm and is made of polybenzoxazole (PBO) is formed on the protective film 10. Hereinafter, the protective film 10 and the interlayer insulating film 12 are collectively referred to as a first insulating film 13. The first insulating film 13 has openings 13a through which parts of the upper surfaces of the source electrode interconnects 11a and parts of the upper surfaces of the drain electrode interconnects 11b.

Figure 3B:
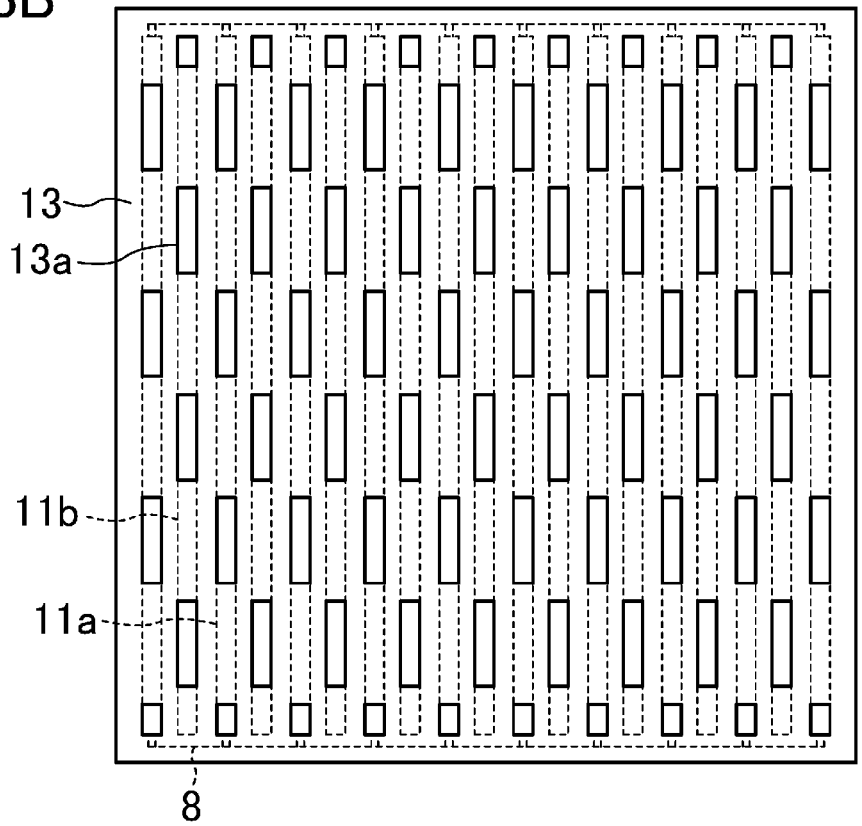

As illustrated in FIG. 3(b), the openings 13a of the first insulating film 13 through which the source electrode interconnects 11a are exposed are arranged substantially in rows across the source electrode interconnects 11a that are parallel to one another. The openings 13a of the first insulating film 13 through which the drain electrode interconnects 11b are exposed are arranged substantially in rows across the drain electrode interconnects 11b that are parallel to one another. The rows of the openings 13a through which the source electrode interconnects 11a are exposed do not overlap the rows of the openings 13a through which the drain electrode interconnects 11b are exposed. In this embodiment, the rows of the openings 13a through which the source electrode interconnects 11a are exposed and the rows of the openings 13a through which the drain electrode interconnects 11b are exposed are alternately arranged in the longitudinal direction of the electrode interconnects 11a and 11b.

Figure 4A:
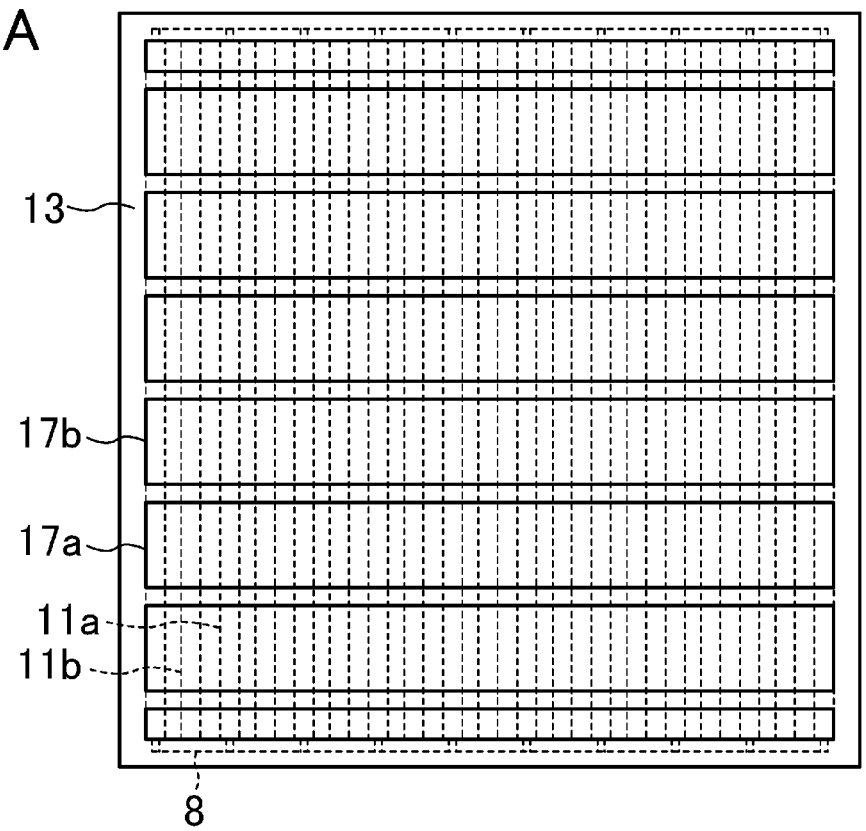
FIGS. 4(a) and 4(b) illustrate layers included in the nitride semiconductor device according to the embodiment of the present disclosure.

First interconnect layers 17a are formed on the first insulating film 13, and the first interconnect layers 17a are in connection to at least parts of the source electrode interconnects 11a through associated ones of the openings 13a. Specifically, as illustrated in FIG. 4(a), the associated openings 13a of the first insulating film 13 are located on the source electrode interconnects 11a that are in electrical connection to the source electrodes 7a, and accordingly, the first interconnect layers 17a are, through the associated openings 13a, at the same potential as the source electrode interconnects 11a that are in electrical connection to the source electrodes 7a. Second interconnect layers 17b are also formed on the first insulating film 13, and the second interconnect layers 17b are in electrical connection to the drain electrode interconnects 11b through associated ones of the openings 13a. The second interconnect layers 17b are at the same potential as the drain electrode interconnects 11b that are in electrical connection to the drain electrodes 7b. The first interconnect layers 17a and the second interconnect layers 17b extend in a direction intersecting the source electrode interconnects 11a and the drain electrode interconnects 11b. The first interconnect layers 17a and the second interconnect layers 17b are alternately spaced from one another. Each of the first interconnect layers 17a and the second interconnect layers 17b includes a lower adhesion layer 14 made of titanium (Ti), a conductive layer 15 made of copper (Cu), and an upper adhesion layer 16 made of nickel (Ni) which are sequentially stacked. The lower adhesion layer 14 made of Ti has a thickness of about 100 nm, the conductive layer 15 made of Cu has a thickness of 5 µm, and the upper adhesion layer 16 made of Ni has a thickness ranging from tens of nm to about 1 µm.

Figure 4B:
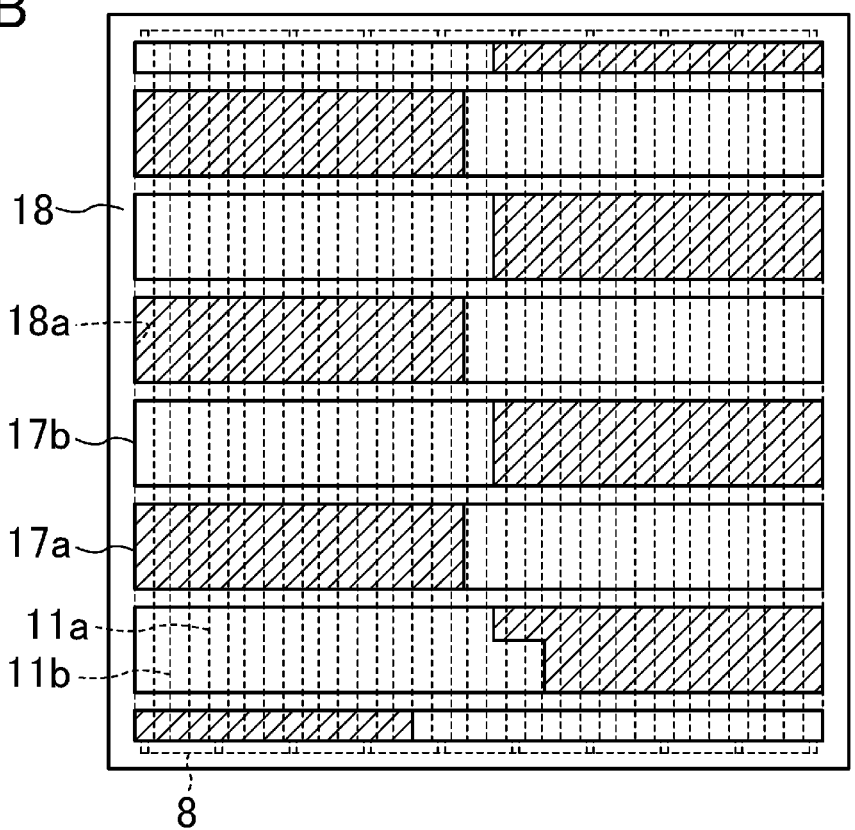

A second insulating film 18 which has a thickness of about 10 µm and is made of PBO is formed on the first interconnect layers 17a and the second interconnect layers 17b. The second insulating film 18 has openings 18a (i.e., the diagonally shaded portions in FIG. 1) through which parts of the upper surfaces of the first interconnect layers 17a and parts of the upper surfaces of the second interconnect layers 17b are exposed. Specifically, in this embodiment, the parts of the first interconnect layers 17a are exposed through the openings 18a located in a left portion of the second insulating film 18 whereas the parts of the second interconnect layers 17b are exposed through the openings 18a located in a right portion of the second insulating film 18, as illustrated in FIG. 4(b).

A source electrode pad layer 22a which is a first pad layer is formed on the second insulating film 18, and the source electrode pad layer 22a is in connection to at least parts of the first interconnect layers 17a through associated ones of the openings 18a. That is, the source electrode pad layer 22a is in connection to the source electrodes 7a through the source electrode interconnects 11a and the first interconnect layers 17a. The source electrode pad layer 22a thus serves as a pad which is at the same potential as the source electrodes 7a. A drain electrode pad layer 22b which is a second pad layer is also formed on the second insulating film 18, and the drain electrode pad layer 22b is in connection to at least parts of the second interconnect layers 17b through associated ones of the openings 18a. The drain electrode pad layer 22b is in electrical connection to the drain electrodes 7b, and the drain electrode pad layer 22b thus serves as a pad which is at the same potential as the drain electrodes 7b. The source electrode pad layer 22a and the drain electrode pad layer 22b are located above the active region. Each of the source electrode pad layer 22a and the drain electrode pad layer 22b includes a lower adhesion layer 19 made of Ti, a conductive layer 20 made of Cu, and an upper metal layer 21 made of Ni which are sequentially stacked. The lower adhesion layer 19 made of Ti has a thickness of about 100 nm, the conductive layer 20 made of Cu has a thickness of about 5 µm, and the upper metal layer 21 made of Ni has a thickness of about 1 µm. Specifically, as illustrated in FIG. 1, the electrode pad layers of this embodiment include, in addition to the source electrode pad layer 22a and the drain electrode pad layer 22b, a gate electrode pad layer 23 which is in connection to the gate electrodes. The electrode pad layers 22a, 22b, and 23 are spaced from one another. The gate electrodes 8 are tied in a bundle outside the active region, and the bundle of the gate electrodes 8 bypasses the outer periphery of the active region to be connected to the gate electrode pad layer 23. This is because the gate electrodes 8 cannot extend across the source electrode interconnects 11a and the drain electrode interconnects 11b. The gate electrodes 8 and the gate electrode pad layer 23 can be connected to each other through, e.g., a via which penetrates the stacked insulating films. These electrode pad layers have dimensions which are larger than dimensions required for connection to external devices. The uppermost layer of each of the electrode pad layers is a Ni layer, on which wire bonding, ribbons, and clips are provided, for example. Connection to the external devices is established through the wire bonding, ribbons, and clips. A Ni layer is excellent in adhesion to Al wires and Al ribbons, and is highly reliable.

On a surface (a back surface) of the substrate 1 opposite to the surface on which the nitride semiconductor layer 3 is located, a back surface electrode 24 made of, e.g., Au or tin (Sn) is formed. It is accordingly possible to give an electric potential to the substrate 1 from outside.

In the nitride semiconductor device of this embodiment, the width of the units which form the transistor structure depends on the width of interconnects of the source electrode interconnects 11a and the drain electrode interconnects 11b. Therefore, increasing the width of interconnects results in an increase in the unit width, and in a decrease in the gate width per unit area of the device. Accordingly, in order to increase the current of the device, it is necessary to reduce the width of interconnects of the source electrode interconnects 11a and the drain electrode interconnects 11b. Reduction of the width of interconnects, however, causes the interconnection resistance of the electrode interconnects 11a and 11b to increase, and thereby leads to an increase in the on-resistance and a decrease in the maximum current per gate width. For the purpose of reducing the resistance of the source electrode interconnects 11a and the drain electrode interconnects 11b, the first interconnect layers 17a and the second interconnect layers 17b extending in a direction intersecting the electrode interconnects 11a and 11b are alternately arranged over the electrode interconnects 11a and 11b. In this manner, it is possible to apparently divide the source electrode interconnects 11a and the drain electrode interconnects 11b, and the resistance of the electrode interconnects can be deemed to be collective resistance of the divided interconnects. That is, the length of interconnects of the source electrode interconnects 11a and the drain electrode interconnects 11b can be reduced and the apparent number of the interconnects can be increased. Accordingly, it is possible to alleviate an increase in the source potential of the source electrode interconnects and a decrease in the maximum current, while reducing the on-resistance caused by the resistance of the source electrode interconnects 11a and the drain electrode interconnects 11b. On the other hand, since an increase in the width of the first interconnect layers 17a and the second interconnect layers 17b results in an increase in the apparent finger length, the width of interconnects needs to be kept small. When the width of interconnects is kept small, the resistance occurring in the first interconnect layers 17a and the second interconnect layers 17b increases, and the on-resistance of the entire device increases. To address this problem, the device of this embodiment includes the source electrode pad layer 22a and the drain electrode pad layer 22b that are respectively in connection to the first interconnect layers 17a and the second interconnect layers 17b through the second insulating film 18. The configuration in which the source electrode pad layer 22a and the drain electrode pad layer 22b cover almost all of the area above the active region except the gate electrode pad layer 23 can reduce the interconnection resistance occurring in the first and second interconnect layers 17a and 17b to about one half of the interconnection resistance of a device in which these electrode pad layers are not formed. As a result, the on-resistance of the entire device can be considerably reduced.

According to the embodiment of the present disclosure, it is possible to obtain a nitride semiconductor device of which the on-resistance is reduced and the maximum current per gate width is large.

Although this embodiment exemplifies the interlayer insulating film 12 and the second insulating film 18 that are made of PBO, each of the films 12 and 18 may be an organic film made of polyimide, benzocyclobutene (BCB), an epoxy photosensitive resin (e.g., SU-8 produced by Kayaku Microchem Corp.), or a fluorine photosensitive resin (e.g., AL-X2 produced by Asahi Glass Co., Ltd.). The interlayer insulating film 12 and the second insulating film 18 are not necessarily made of a single material, and may be formed by combining some of the above materials. In this manner, it is possible to perform film formation which takes advantage of the characteristics of the combined materials. In addition, since these organic films can be formed by spin coating, recesses can be easily filled, and the upper surface of the filled recesses can be easily flatted. Although it is preferable to use lithography for forming openings in the organic films, the openings may be formed by dry etching with use of a silicon dioxide ($SiO_2$) film as a hard mask, for example. The organic materials significantly vary in water permeability and moisture resistance. For example, an insulating film made of a polyimide film, which has hygroscopicity, may expand, and cracks and moisture may reduce reliability of the nitride semiconductor device. When a polyimide film is used as an insulating film, it is preferable to form a water-resistant film such as a SiN film on the polyimide film, and to form openings by dry etching.

Each of the source electrode interconnects Ila and the drain electrode interconnects 11b includes the Ti layer serving as an adhesion layer to the layer located under the electrode interconnects, and the Au layer serving as a conductive layer. On the other hand, since PBO used to form the interlayer insulating film 12 has poor adhesiveness to an Au layer, it is necessary to provide the protective film 10 made of SiN. However, when a material such as AL-X2 which has relatively high adhesiveness to an Au layer is used to form the interlayer insulating film 12, the protective film 10 is not necessary. In this case, in view of the moisture resistance of the device, the electrode insulating film 6 is preferably made of a SiN film. When the uppermost layers of the source electrode interconnects 11a and the drain electrode interconnects 11b are made of a material such as Ti or Ni which has relatively high adhesiveness to an organic film, the protective film 10 is also unnecessary to be formed. However, in order to reduce degradation of the nitride semiconductor device caused by moisture, it is preferable to form the protective film 10.

Although the electrode insulating film 6 and the protective film 10 of this embodiment are SiN films, each of the films 6 and 10 may be an insulating film made of, e.g., $SiO_2$ or a composite film made of SiN and $SiO_2$. However, any one of the electrode insulating film 6 or the protective film 10 is preferably made of a SiN film that has high moisture resistance. The SiN film and the $SiO_2$ film can be formed by plasma enhanced chemical vapor deposition.

As described above, it is preferable to form the openings of the interlayer insulating film 12 by means of lithography. When a PBO film or a BCB film is used as the interlayer insulating film 12, hard baking tends to cause the openings of the film 12 to increase in size as compared to the size observed immediately after development. In this case, the distance between a specific one of the source electrode interconnects 11a or the drain electrode interconnects 11b and another electrode interconnect adjacent to the specific electrode interconnect may be larger than the distance between the opening 13a through which the specific electrode interconnect is exposed and the electrode interconnect adjacent to the specific electrode interconnect. Here, let S (m) denote the smaller distance of the foregoing two distances, and let A (V/m) denote a dielectric breakdown voltage of the interlayer insulating film 12. In order to have a breakdown voltage of V (V) or more, the semiconductor device at least needs to meet the formula: $S \geq V/A$. Specifically, to have a breakdown voltage of 600 V which is an index of the breakdown voltages of power devices, a device needs to meet the formula: $S \geq 600/A$. A target breakdown voltage of the semiconductor device of this embodiment is 1000 V, and the dielectric breakdown voltage of the PBO film is 250 V/μm. Accordingly, S needs to be 4 μm or more. In addition, the distance from the source electrode interconnects 11a or the drain electrode interconnects 11b to the first interconnect layers 17a or the second interconnect layers 17b also needs to meet the above formula. Therefore, the interlayer insulating film 12 is designed to have a thickness of about 10 μm. However, taking into consideration a dielectric breakdown voltage of the protective film 10, the thickness of the interlayer insulating film 12 can be further reduced.

The thickness of the second insulating film 18 can be determined in a manner similar to the above. The thickness of the second insulating film 18 of this embodiment is about 10 μm. Specifically, it is suitable that the distance between the first interconnect layers 17a and the source electrode pad layer 22a and the distance between the second interconnect layers 17b and the drain electrode pad layer 22b each correspond to the film thickness that has the dielectric breakdown voltage as determined above.

This embodiment exemplifies the nitride semiconductor device including the source electrodes 7a and the drain electrodes 7b made of Ti or Al. Alternatively or additionally, Ni, Au, vanadium (V), or hafnium (Hf) may be used as a material for the electrodes 7a or 7b. The electrodes 7a and 7b are preferably formed by a lift-off process. The gate electrodes 8 are made of Pd or Au. Alternatively or additionally, Ni or Ti may be used as a material for the gate electrodes 8. The gate electrodes 8 are preferably formed by the lift-off process.

This embodiment exemplifies the source electrode interconnects 11a and the drain electrode interconnects 11b each including the Ti layer serving as an adhesion layer to the layer located under the electrode interconnects, and the Au layer having a high conductivity. However, a tantalum (Ta) layer or a Ni layer may be formed instead of the Ti layer, and a Cu layer or an Al layer may be formed instead of the Au layer. The source electrode interconnects 11a, the drain electrode interconnects 11b, the first interconnect layers 17a, the second interconnect layers 17b, the source electrode pad layer 22a, and the drain electrode pad layer 22b, all of which are metal layers having a large thickness, are preferably formed by plating.

This embodiment exemplifies the first interconnect layers 17a and the second interconnect layers 17b each of which includes the lower adhesion layer 14 made of Ti, and the source electrode pad layer 22a and the drain electrode pad layer 22b each of which includes the lower adhesion layer 19 made of Ti. However, Ta, TaN, TiN, or Ni may be used as an alternative, additional or combinable material. In addition to these materials, the lower adhesion layer 14 may be made of a material which is more adhesive to the interlayer insulating film 12 than to the conductive layer 15. In a similar manner, the lower adhesion layer 19 may be made of a material which is more adhesive to the second insulating film 18 than to the conductive layer 20. It is preferable that the lower adhesion layer 14 is designed not only to serve to improve the adhesion to the interlayer insulating film 12 located under the layer 14, but also to function as a diffusion preventing film for the conductive layer 15.

This embodiment exemplifies the first interconnect layers 17a and the second interconnect layers 17b each of which includes the conductive layer 15 made of Cu, and the source electrode pad layer 22a and the drain electrode pad layer 22b each of which includes the conductive layer 20 made of Cu. Alternatively or additionally, Au or Al may be used as a material for the conductive layers 15 and 20, for example. In addition to these materials, each of the conductive layers 15 and 20 may be formed by using a material whose conductivity is higher than that of the lower adhesion layers 14 and 19. However, to increase adhesion of the wires used for wire bonding, it is preferable that the upper surface of each of the first interconnect layers 17a, the second interconnect layers 17b, the source electrode pad layer 22a, and the drain electrode pad layer 22b is flat. Accordingly, the conductive layers 15 and 20 are preferably made of Cu. Cu can be used in via-filling plating by which the via holes are preferentially filled by addition of an additive agent.

Each of the first interconnect layers 17a and the second interconnect layers 17b includes, for adhesion to the second insulating film 18, the upper adhesion layer 16 that is made of Ni. This Ni layer is preferably made by plating continuously from formation of the conductive layer 15, which is located under the Ni layer and has been formed by plating. If the Ni layer, of which the conductivity is not high, had a large thickness, contact resistance would be increased. It is therefore preferable that the Ni layer has a small thickness, and the Ni layer is the so-called flash plating having a thickness of 1 μm or less at most, and more preferably a thickness ranging from tens of nm to 500 nm. In addition, the Ni layer preferably has a glossiness of 1 or more. Specifically, it is preferable to add a brightener to a Ni plating bath solution, and Watts bath is used more preferably than sulfamate bath. When the second insulating film 18 that is stacked on the Ni layer is made of a photosensitive material, it is necessary to develop the second insulating film 18 having a large thickness. If the material for the layer located under the second insulating film 18 had a low glossiness, many parts would remain insufficiently developed. Therefore, the uppermost layers of the first interconnect layers 17a and the second interconnect layers 17b are preferably made of a material capable of increasing glossiness. For example, when Ni is used to form the uppermost layers, it is preferable to perform plating with adding of an additive agent which is capable of increasing glossiness. Further, the upper adhesion layer 16 may be made of, instead of Ni, a material which is more adhesive to the second insulating 18 film than to the conductive layer 15. When the conductive layer 15 is made of Cu, Cu may be disadvantageously diffused in the second insulating film 18. Accordingly, the upper adhesion layer 16 preferably functions as a diffusion preventing film which prevents diffusion of Cu, and the upper adhesion layer 16 may be made of, e.g., Ti, Ta, TaN, or TiN, instead of Ni.

Each of the source electrode pad layer 22a and the drain electrode pad layer 22b includes the upper metal layer 21 made of Ni and stacked uppermost. This Ni layer is preferably made by plating continuously from formation of the conductive layer 20, which is located under the Ni layer and has been formed by plating. This is because wire and other components are bonded on the electrode pads layers. If the wires, ribbons, and clips are made of Al, the upper metal layer 21 is preferably made of Ni or Ag. If the wires, ribbons, and clips are made of Au or Cu, the upper metal layer 21 included in each of the pad layers 22a and 22b is preferably made of Au. That is, it is preferable that the upper metal layer 21 is made of a material which is suitable for connection of the bonding wires and other components.

A protective insulation film may be formed on a region which is located on the source electrode pad layer 22a and the drain electrode pad layer 22b and in which wire bonding is not provided actually. The protective insulation film may be made of an organic resin material as used for forming the interlayer insulating film 12 or the second insulating film 18, or a material whose cure temperature is lower than that of the organic resin material. It is preferable that the protective insulation film has good adhesiveness to a sealing resin material of the package of the semiconductor device.

In this embodiment, the source electrode interconnects 11a and the drain electrode interconnects 11b have a relatively large thickness of about 5 μm. It is also possible to reduce the thickness of the source electrode interconnects 11a and the drain electrode interconnects 11b as long as the resistance components produced in the electrode interconnects 11a and 11b are within an acceptable range. Reduction of the thickness of the source electrode interconnects 11a and the drain electrode interconnects 11b enables reduction of steps in the entire device, and thereby enables improvement of adhesion to the wire bonding. The resistance components of the source electrode interconnects 11a and the drain electrode interconnects 11b are determined depending on the widths of the first interconnect layers 17a and the second interconnect layers 17b, i.e. the lengths of the resistance components of the source electrode interconnects 11a and the drain electrode interconnects 11b. The resistance of the electrode interconnects decreases as the widths of the first interconnect layers 17a and the second interconnect layers 17b is reduced, as the lengths of the resistance components of the source electrode interconnects 11a and the drain electrode interconnects 11b are reduced, and as the apparent number of the source electrode interconnects 11a and the drain electrode interconnects 11*b* is increased. Accordingly, it is possible to design the source electrode interconnects 11*a* and the drain electrode interconnects 11*b* to have a relatively small thickness. In a similar manner, the resistance of the first interconnect layers 17*a* and the second interconnect layers 17*b* depends on, in addition to the width of interconnects and the thicknesses of the layers, the shapes of the source electrode pad layer 22*a* and the drain electrode pad layer 22*b*. Accordingly, it is necessary to design the interconnect layers 17*a* and 17*b* such that the on-resistance of the entire device will be within an acceptable range. If the area jointed to an external substrate is large, as the area which a flip-chip type device has, it is not highly necessary to increase the thickness of the source electrode pad layer 22*a* and the drain electrode pad layer 22*b*. However, if wire bonding is provided in part of the electrode pad layers, for example, sheet resistance from the joint portion directly affects the on-resistance. In such a case, it is necessary to design the electrode pad layers 22*a* and 22*b* to have a large thickness.

In the nitride semiconductor device of this embodiment, the back surface electrode 24 is made of Au or Sn. Alternatively or additionally, chromium (Cr) or Ni may be used to form the back surface electrode 24. The back surface electrode 24 may be formed by, e.g., sputtering or vapor deposition. Further, the back surface electrode 24 may penetrate the substrate 1 to be electrically connected to the source electrodes 7*a* or the drain electrodes 7*b*, and may function as a source electrode pad layer or a drain electrode pad layer. It is also possible to configure the device such that the source electrodes 7*a* or the drain electrodes 7*b* penetrate the buffer layer 2 to be in connection to the back surface electrode 24 through the substrate 1 that is made conductive.

Although this embodiment exemplifies the nitride semiconductor device that is a FET, the nitride semiconductor device may have a diode structure. In such a case, the first electrodes and the second electrodes may be designed as anode electrodes and cathode electrodes, respectively.

(First Variation of Embodiment)

A nitride semiconductor device according to a first variation of the embodiment of the present disclosure will be described below with reference to FIG. 5. In this variation, description of the same components as those of the embodiment is not repeated, and only differences between this variation and the embodiment are described.

The nitride semiconductor device of this variation includes a source electrode pad layer and a drain electrode pad layer each include a plurality of pad layers which are at the same potential.

Figure 5:
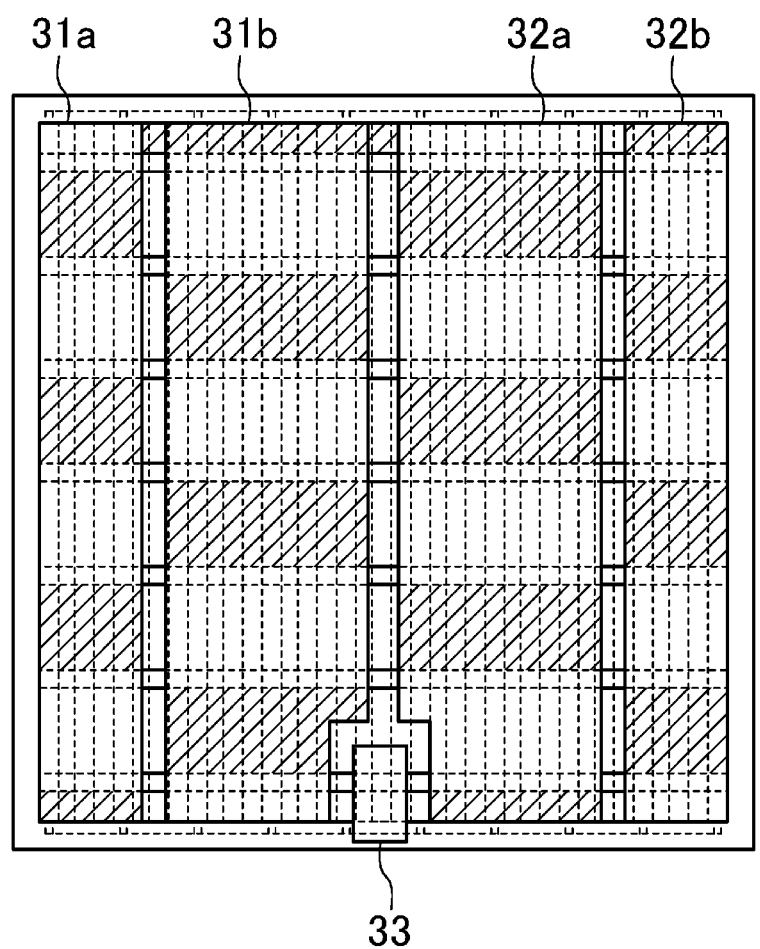
FIG. 5 is a plan view illustrating a nitride semiconductor device according to a first variation of the embodiment of the present disclosure.

Specifically, as illustrated in FIG. 5, a first source electrode pad layer 31*a* and a second source electrode pad layer 32*a*, each of which is a first pad layer, are formed on a second insulating film, and the first source electrode pad layer 31*a* and the second source electrode pad layer 32*a* are in connection to first interconnect layers through associated ones of openings (i.e., the diagonally shaded portions in FIG. 5) of the second insulating film. Also, a first drain electrode pad layer 31*b* and a second drain electrode pad layer 32*b*, each of which is a second pad layer, are formed on the second insulating film, and the first drain electrode pad layer 31*b* and the second drain electrode pad layer 32*b* are in connection to second interconnect layers through associated ones of the openings of the second insulating film. A gate electrode pad layer 33 is formed in a manner similar to the above embodiment.

This configuration enables reduction of the component length of the interconnection resistance of the first interconnect layers which are located below, and thereby enables reduction of the resistance occurring in the first interconnect layers. Specifically, in the device configured to have the two source electrode pad layers and the two drain electrode pad layers, the length of interconnects that contributes the resistance of the first and second interconnect layers can be reduced to about one quarter of the length of interconnects of a device which does not include such pad layers. As a result, the on-resistance of the entire device can be reduced.

According to the first variation of the embodiment of the present disclosure, it is possible to obtain the nitride semiconductor device of which the on-resistance is reduced and the maximum current per gate width is large.

(Second Variation of Embodiment)

A nitride semiconductor device according to a second variation of the embodiment of the present disclosure will be described below with reference to FIG. 6. In this variation, description of the same components as those of the embodiment is not repeated, and only differences between this variation and the embodiment are described.

The nitride semiconductor device according to this variation has a double-gate structure including two gate electrodes. In this variation, electrodes corresponding to the source electrodes of the above embodiment serve as S1 electrodes, and electrodes corresponding to the drain electrodes of the above embodiment serve as S2 electrodes. In the above embodiment, the gate electrodes (corresponding to first gate electrodes, i.e. G1 electrodes) are formed under the source electrode interconnects. On the other hand, this variation further includes second gate electrodes (i.e., G2 electrodes) formed under electrode interconnects (corresponding to the drain electrode interconnects) which are in direct connection to the S2 electrodes. In the nitride semiconductor device of this variation, an S1 electrode pad layer is in electrical connection to the S1 electrodes whereas an S2 electrode pad layer is in electrical connection to the S2 electrodes, and each of the S1 electrode pad layer and the S2 electrode pad layer includes a plurality of pad layers which are at the same potential.

Figure 6:
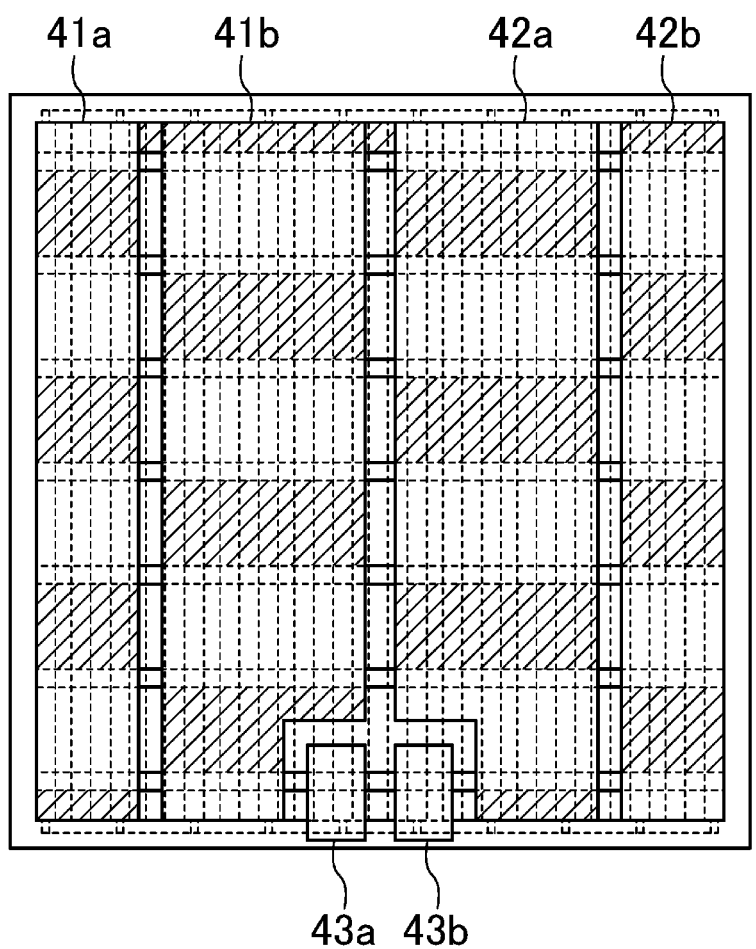
FIG. 6 is a plan view illustrating a nitride semiconductor device according to a second variation of the embodiment of the present disclosure.

Specifically, as illustrated in FIG. 6, a first S1 electrode pad layer 41*a* and a second S1 electrode pad layer 42*a*, each of which is a first pad layer, are formed on a second insulating film, and the first S1 electrode pad layer 41*a* and the second S1 electrode pad layer 42*a* are in connection to first interconnect layers through associated ones of openings (i.e., the diagonally shaded portions in FIG. 6) of the second insulating film. Also, a first S2 electrode pad layer 41*b* and a second S2 electrode pad layer 42*b*, each of which is a second pad layer, are formed on the second insulating film, and the first S2 electrode pad layer 41*b* and the second S2 electrode pad layer 42*b* are in connection to second interconnect layers through associated ones of the openings of the second insulating film. Further, on a portion of the second insulating film located outside an active region, a G1 electrode pad layer 43*a* is formed such that the G1 electrode pad layer 43*a* is in electrical connection to the G1 electrodes through an associated one of the openings of the second insulating film. In a similar manner, a G2 electrode pad layer 43*b* is formed such that the G2 electrode pad layer 43*b* is in electrical connection to the G2 electrodes.

According to the second variation of the embodiment of the present disclosure, in a manner similar to the nitride semiconductor device with a single-gate structure, it is possible to obtain the nitride semiconductor device with the double-gate structure of which the on-resistance is reduced and the maximum current per gate width is large.

As described above, the nitride semiconductor devices of the present disclosure can reduce the on-resistance and increase the maximum current per gate width. In particular, the present disclosure is useful for, e.g., nitride semiconductor devices including electrode pads provided above an active region.

What is claimed is:

1. A nitride semiconductor device comprising:
   a substrate;
   a nitride semiconductor layer formed over the substrate and including an active region;
   first electrode interconnect layers and second electrode interconnect layers alternately spaced from one another over the active region of the nitride semiconductor layer;
   a first insulating film formed on the first and second electrode interconnect layers, and including a plurality of first openings through which the first and second electrode interconnect layers are exposed;
   first interconnect layers and second interconnect layers alternately spaced from one another on the first insulating film, the first interconnect layers being in electrical connection to the first electrode interconnect layers through associated ones of the first openings and extending in a direction intersecting with the first electrode interconnect layers, the second interconnect layers being in electrical connection to the second electrode interconnect layers through associated ones of the first openings and extending in a direction intersecting with the second electrode interconnect layers;
   a second insulating film formed on the first and second interconnect layers, and including a plurality of second openings through which the first and second interconnect layers are exposed; and
   a first pad layer and a second pad layer spaced from each other on the second insulating film and located above the active region, the first pad layer being in electrical connection to the first interconnect layers through associated ones of the second openings, the second pad layer being in electrical connection to the second interconnect layers through associated ones of the second openings.

2. The nitride semiconductor device of claim 1, wherein each of the first interconnect layers and the second interconnect layers includes a plurality of metal layers.

3. The nitride semiconductor device of claim 2, wherein in each of the first interconnect layers and the second interconnect layers, an uppermost metal layer is more adhesive to the second insulating layer than to a lower metal layer which is in contact with the uppermost metal layer.

4. The nitride semiconductor device of claim 2, wherein each of the first interconnect layers and the second interconnect layers includes a first metal layer being in contact with the first insulating film, a second metal layer formed on the first metal layer, and a third metal layer which is an uppermost layer formed on the second metal layer,
the first metal layer is more adhesive to the first insulating film than to the second and third metal layers,
the second metal layer is made of a metal whose conductivity is higher than that of the first metal layer, and
the third metal layer is more adhesive to the second insulting film than to the first and second metal layers.

5. The nitride semiconductor device of claim 2, wherein an uppermost metal layer of each of the first interconnect layers and the second interconnect layers has a glossiness of 1 or more.

6. The nitride semiconductor device of claim 1, wherein each of the first pad layer and the second pad layer includes a plurality of pad layers which are at an identical potential, and
the plurality of pad layers are each in connection to an external device.

7. The nitride semiconductor device of claim 1, wherein each of the first pad layer and the second pad layer includes a plurality of metal layers.

8. The nitride semiconductor device of claim 1, wherein each of the first and second electrode interconnect layers includes an electrode which is located on and in direct connection to the nitride semiconductor layer, and an electrode interconnect formed on the electrode,
an electrode insulating film including openings through which the electrodes included in the first and second electrode interconnect layers are exposed is formed on the nitride semiconductor layer, and
the electrode interconnects included in the first and second electrode interconnect layers are in electrical connect to the electrodes through the openings of the electrode insulating film.

* * * * *